United States Patent
Ellis et al.

(10) Patent No.: US 8,120,121 B2
(45) Date of Patent: Feb. 21, 2012

(54) SEMICONDUCTOR DEVICE

(75) Inventors: John Nigel Ellis, Tavistock (GB); Piet De Pauw, Oudenaarde (BE)

(73) Assignees: X-Fab Semiconductor Foundries AG (DE); Melexis Tessenderlo N.V. (BE)

( * ) Notice: Subject to any disclaimer, the term of this patent is extended or adjusted under 35 U.S.C. 154(b) by 138 days.

(21) Appl. No.: 12/441,165

(22) PCT Filed: Sep. 13, 2007

(86) PCT No.: PCT/GB2007/050541
§ 371 (c)(1),
(2), (4) Date: May 5, 2009

(87) PCT Pub. No.: WO2008/065441
PCT Pub. Date: Jun. 5, 2008

(65) Prior Publication Data
US 2010/0019343 A1    Jan. 28, 2010

(30) Foreign Application Priority Data
Sep. 13, 2006 (GB) .................................. 0617958.4

(51) Int. Cl.
H01L 27/088 (2006.01)
H01L 31/102 (2006.01)
H01L 21/70 (2006.01)
(52) U.S. Cl. ............... 257/392; 257/500; 257/E27.011
(58) Field of Classification Search ............ 257/500, 257/E27.011, 392, 458
See application file for complete search history.

(56) References Cited

U.S. PATENT DOCUMENTS

| 4,589,004 | A | | 5/1986 | Yasuda et al. |
| 5,401,999 | A | * | 3/1995 | Bayraktaroglu .............. 257/458 |
| 5,851,864 | A | * | 12/1998 | Ito et al. ....................... 438/203 |
| 5,911,104 | A | * | 6/1999 | Smayling et al. ............. 438/202 |
| 6,392,282 | B1 | | 5/2002 | Sahara et al. |
| 7,541,627 | B2 | * | 6/2009 | Hynecek et al. .............. 257/224 |
| 2004/0227183 | A1 | | 11/2004 | Negoro et al. |
| 2006/0237815 | A1 | | 10/2006 | Kim et al. |

FOREIGN PATENT DOCUMENTS

| EP | 1339101 | 8/2003 |
| JP | 61-247068 | 11/2004 |
| JP | 2005-101272 | 4/2005 |
| WO | 2004/008537 | 1/2004 |

OTHER PUBLICATIONS

Search Report, United Kingdom Application No. 0617958.4 (Apr. 12, 2007).
International Search Report, PCT/GB2007/050541 (mailed Jan. 26, 2008; published Jun. 5, 2008).
EP, Examination Report, European Application No. 07870409.5 (Jul. 13, 2011).

* cited by examiner

*Primary Examiner* — Lex Malsawma
(74) *Attorney, Agent, or Firm* — Thompson Hine LLP

(57) ABSTRACT

A semiconductor device including a first transistor in a substrate, a second transistor in the substrate, and a further device in the substrate. The second transistor and the further device are arranged to operate at a second voltage which is higher than a first voltage. The first voltage is the (normal) voltage of operation of the first transistor, and the first transistor is isolated from the second voltage.

10 Claims, 1 Drawing Sheet

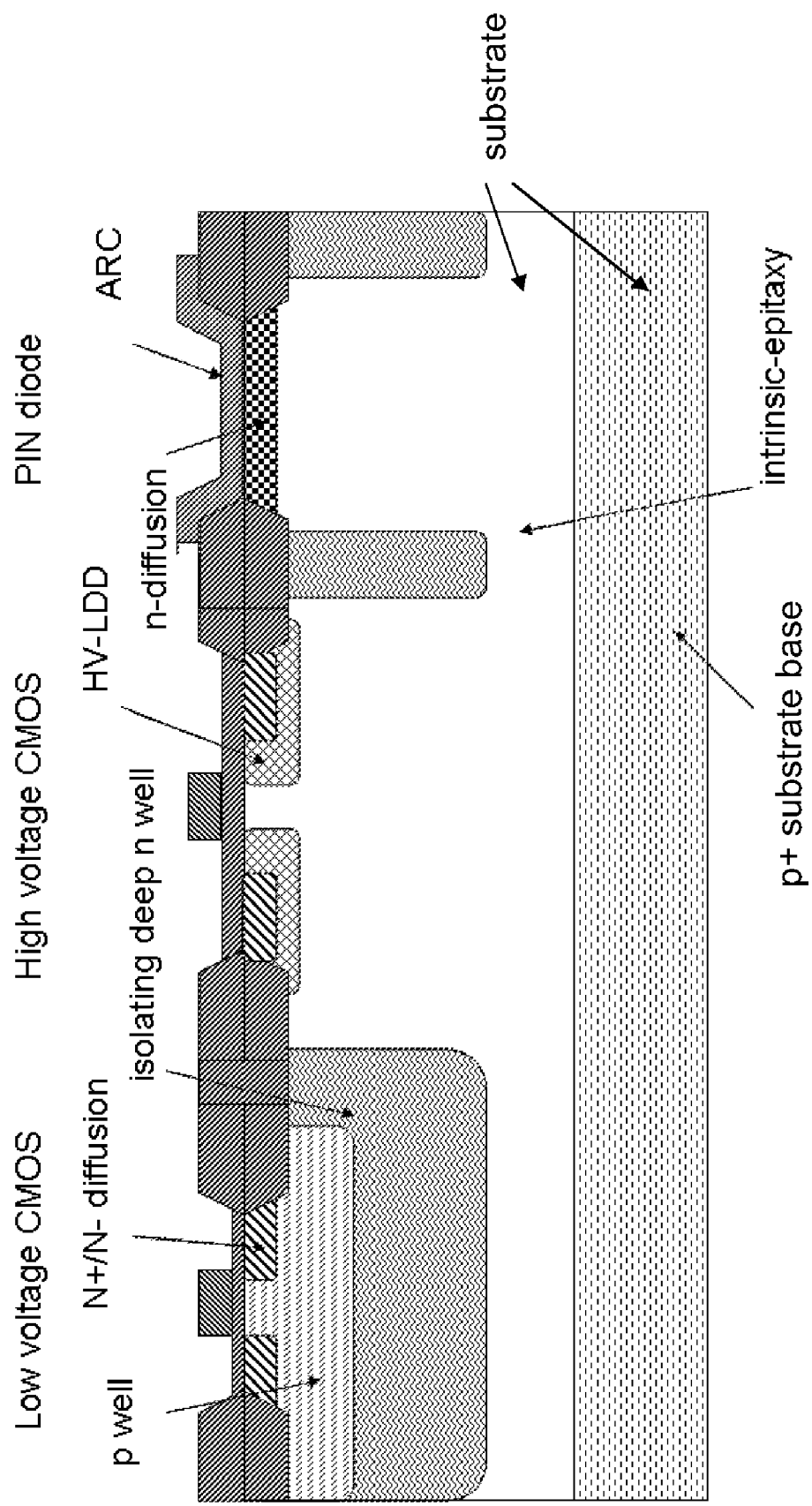

SEMICONDUCTOR DEVICE

BACKGROUND

The present invention relates to semiconductor devices. It finds particular application in the context of PIN diodes but can also be used in conjunction with other diodes and indeed semiconductor devices other than diodes. The present invention will mainly be described with reference to a PIN diode, and it will be clear to one skilled in the art how the technique would need to be adapted when used with devices other that PIN diodes.

PIN diodes can be used for capturing light signals in the spectrum from red (~650 nm) to infra-red (~1.2 micrometer), but not exclusive to that range of wavelengths. PIN diodes comprise a P and N region of semiconductor at the ends of an intrinsic region (I). Efficient operation of a PIN diode requires an extended width of intrinsic silicon which enables capture of a substantial part of the optical energy which typically lies in the region of 10 to 50 microns for around 800 nm wavelengths. In order to optimize operation of these diodes a depletion region is required to extend across the whole length of the region from the P to the N junction. Depending on the thickness and doping level of the intrinsic region, which is rarely intrinsic but often very lightly doped (purely intrinsic would require silicon built to an impurity level of less than 1 part in a trillion (1 in $10^{12}$) and difficult to achieve in practice) an external voltage is applied to the diode so as to increase the width of the depletion region until the full width of the intrinsic or lightly doped region is encompassed. If a silicon layer with a resistivity of a few hundred ohms·cm or more is deposited over a heavily doped substrate, voltages to fully deplete the layer can be in the region of 1 to 10 V, although other voltages can be used.

SUMMARY

The present inventors have appreciated that often a bias voltage is required which may be higher than the supply. They have devised a technique which allows the component requiring the relatively high bias voltage to be combined, on the same substrate, with other components which are normally operated at a lower voltage.

If a bias voltage is required which may be higher than the supply, (for example, 10V may be required for a PIN diode whereas 3.3V is the normal supply voltage for a CMOS process of 0.35 microns) a circuit using a charge pump can be employed. In order to make an efficient charge pump circuit, it is proposed to include isolated transistors which allow the CMOS transistors to operate at normal voltages but enabling the substrate to operate at a different voltage, in order to bias the PIN diode optimally. Depending on the technology, the substrate could be P-type, and in this case the operating voltage may be negative; or, on a BiCMOS process the PIN diode cathode could be biased to a positive voltage greater than the normal supply, or if the substrate were N-type the PIN diode could also be operated at higher supply voltages than the CMOS logic.

In one aspect the present invention provides a semiconductor device comprising:
  a first transistor in a substrate;
  a second transistor in said substrate; and
  a further device in said substrate,
    wherein the second transistor and the further device are arranged to operate at a second voltage which is higher than a first voltage, wherein the first voltage is the (normal) voltage of operation of the first transistor, and wherein the first transistor is isolated from the second voltage.

BRIEF DESCRIPTION OF THE DRAWING

Some preferred embodiments of the invention will now be described by way of example only and with reference to the accompanying drawing, in which the single FIGURE shows a section through a preferred embodiment.

DETAILED DESCRIPTION

As shown in the FIGURE, a low voltage transistor is provided in a deep diffusion, with a high voltage transistor using a thicker gate oxide, and a PIN diode. The PIN diode is covered with an ARC (anti-reflection coating) layer, although this is optional. The low voltage transistor, the high voltage transistor and the PIN diode are all combined in the same substrate.

Isolated transistors can be provided in an IC process by using deeply diffused junctions, into which the low voltage transistors can be built. Therefore, a combination of deep diffusion regions (or other means of isolation of the CMOS from the substrate including trench isolation) would allow the substrate (or a terminal of the PIN diode which isolates itself from the substrate such as for a buried N layer in a BiCMOS process) to be biased in such a way that a highly efficient optical detector diode using PIN construction can be built. The isolation of the CMOS from the substrate then enables the epitaxial layer to be optimised for the PIN diode. Therefore, a thick, lightly doped epitaxial layer can be used. Further, in order to provide the high voltage needed to optimise the PIN diode operation, a charge pump is included. Since the operating voltage of the PIN diode can be significantly higher than the normal operating voltage of the CMOS, it is advantageous to include high voltage transistors which can operate with a gate voltage at the high voltage level. Therefore, a process is envisaged where high voltage transistors are included together with standard low voltage transistors, which are isolated from the substrate by means of a junction or other features such as trench, and all devices are formed in an epitaxial layer which is optimised for PIN diode performance.

It is possible to combine these three devices at a technology node for 0.35 micrometer CMOS which operates normally at 3.3V, or at other nodes such as 0.18 micron CMOS where the operating voltage for the CMOS is even lower at 1.8V, but the PIN diode may still require biasing at around 10V. The PIN diode bias voltage can be formed by substrate bias voltages which are at zero, or negative in the case of P-type material, or zero or positive for N-type material.

Further improvements to the device can be made by removing insulating layers from the PIN diode region towards the end of the manufacturing process, and depositing or otherwise forming an optically active film. For example, this could be a silicon nitride layer optimised to give an anti-reflective property at the wavelength required, or other materials and layers in combination which could form band-pass or other filter operations.

Several features of embodiments of the invention will now be listed. Not all features are necessarily present in all embodiments.

EMBODIMENT 1

An IC process which has the following features:
(1) a P and N junction at each end of an intrinsic layer of silicon which may be 100 ohm·cm or higher (in principle there is no upper limit other than the fact that purely intrinsic silicon would be about 250 kilohm·cm) but a practical lower limit determined by the voltage required to fully deplete the layer;
(2) an isolated low voltage transistor or set of both NMOS and PMOS devices which can operate at a different potential from the substrate or at least from the PIN diode;
(3) a high voltage transistor or set of PMOS and NMOS devices which can be used to provide a charge pump function to generate a different voltage from the normal supply voltage so as to bias the PIN diode to its optimum operating point.

EMBODIMENT 2

As embodiment 1, but which also has an optical coating over the PIN diode which comprises at least one quarter-wave layer to form an anti-reflective coating, but may comprise several layers optionally with a lens over the circuit.

EMBODIMENT 3

As embodiment 1 or 2, but the high voltage transistors can be built with gate oxides which are normally thicker than the standard technology requires. For example, a preferred embodiment would be 0.35 micron technology having a gate oxide of 7 nm, but high voltage transistors with 40 nm oxide. Alternatively, other thicknesses can be used, and the technique is not limited to two thicknesses. The substrate material can be P-type or N-type. N-type may be advantageous for some PIN diode applications. The bias voltage generated for the PIN diode could be positive or negative, depending on whether the core process is CMOS or BiCMOS and substrate type. P-type substrates could be biased negatively for standard CMOS; or the PIN diode could be pumped to a higher voltage if the process enabled an isolated cathode to be used such as on BiCMOS. Or, if the substrate were N-type the substrate could also be pumped to a higher voltage than the supply in order to operate the PIN diode.

EMBODIMENT 4

As any of embodiments 1 to 3, but in addition there may be some circuit aspects in which large capacitors are used to store the bias potential, and arrangements made to the circuit so that during a read-out of the optical diodes, the substrate pump is turned off so as to reduce noise.

EMBODIMENT 5

As any of embodiments 1 to 3, with high value capacitances as per embodiment 4, but where the capacitor structures could be overlying the PIN diode if they were transparent. Hence it would be possible to use polysilicon diodes over the PIN diode, which although they may require some adjustment to the anti-reflective coating and may cause some reduction in efficiency, would allow the same optical window to be used as a capacitor to assist in storing the charge from the pump voltage to assist in embodiment 4 in which the pump is turned off to reduce noise during a measurement or read-out of the cell.

EMBODIMENT 6

As any of embodiments 1 to 5, but using trench isolation instead of diffusions. In this case of trench isolation it would be possible in principle to completely isolate PIN diodes from each other throughout the whole of the epitaxial layer. Therefore trench isolation is specifically mentioned where the trench is etched through the whole of the epitaxial layer into the substrate base in order to prevent optically generated carriers from travelling between one pixel and a neighbour.

The PIN diode could be coated with an optical layer which may comprise silicon nitride; or other materials such as silicon dioxide, or other materials with refractive indexes which are desirable for creating band-pass or edge filters.

By way of a preferred embodiment, the substrate would comprise a heavily doped P-type silicon substrate base, onto which a thick epitaxial layer is grown. The epitaxial layer may be 25 micrometer of preferably 1000 ohm·cm or at least very lightly doped with phosphorus to less than $10^{13}$ atoms/cm3. A deep diffusion of about 6 micrometer of phosphorus creates an isolating NWell in the epitaxial layer. Low voltage NMOS transistors can be formed in the NWell, which are built into a low voltage Pwell, isolated by the Nwell. PMOS transistors can therefore be manufactured using normal low voltage Nwells possibly augmented by deep wells to achieve higher isolation. Preferably, but not exclusively, high voltage transistors can be built into the same deep diffused wells as are used to isolate the low voltage transistors, which can then be used in charge pumps to generate the bias voltage needed to deplete the lightly doped, thick epitaxial layer. These high voltage transistors can use 40 nm oxides, withstanding operation up to 20V or more, continuously. Preferably, a capacitor is also required with a high breakdown voltage to enable the charge pump to function and the preferred embodiment would combine 40 nm and 7 nm gate oxides, with deep and shallow wells, and a double poly or double metal capacitor which can withstand the bias voltage required on the PIN diode.

It will be apparent to one skilled in the art that the device could also be manufactured on an N-type substrate base, which would be pumped to a positive voltage. While the preferred embodiment is on P-type for compatibility, it may be desired to build the devices on N-type substrate bases. On these substrate bases, the epitaxy-to-substrate base boundary can be much better defined (shorter transition) due to the low diffusion of e.g. antimony compared with boron, and therefore the PIN diode response will be faster.

APPLICATIONS

Applications for this invention include optical communication devices, high-speed communication circuits and imaging systems where high performance response is required in the infrared region between about 700 nm and 1.5 microns, but is not limited to these application areas and wavelengths. While many IR applications are for remote control systems, night vision in camera-type chips can benefit from PIN diodes which have high sensitivity and speed.

The abovementioned embodiment using trench isolation could be constructed as follows. Instead of the isolating deep NWell shown in the FIGURE an oxide layer could be employed, e.g. using a buried SOI (silicon on insulator) layer. The oxide layer would be positioned under the low voltage CMOS transistor in the FIGURE (but not at the sides). A deep trench would then be cut around the low voltage transistor to isolate it against the remainder of the structure. The trench may be filled with an isolating material, such as an oxide.

In all of the above embodiments, instead of an epitaxial layer a very lightly doped intrinsic layer could be used.

As mentioned above, the invention is not restricted to PIN diodes. Instead of a PIN diode it would be possible to use a phototransistor or a diode in avalanche mode. Such a diode could be an "ordinary" diode (i.e. not a PIN diode). In some embodiments the diode (or alternative device) could be operated at voltages of 50V or more.

In summary, it will be seen that preferred embodiments of the invention provide an integrated circuit process for combined high voltage and optical detector devices (preferably optical detector diodes).

Although the invention has been described in terms of preferred embodiments as set forth above, it should be understood that these embodiments are illustrative only and that the invention is not limited to those embodiments. Those skilled in the art will be able to make modifications and alternatives in view of the disclosure which are contemplated as falling within the scope of the invention. Each feature disclosed or illustrated in the present specification may be incorporated in the invention, whether alone or in any appropriate combination with any other feature disclosed or illustrated herein.

What is claimed is:

1. A semiconductor device comprising:
   a first transistor in a substrate;
   a second transistor in said substrate; and
   a further device in said substrate,
   wherein the second transistor and the further device are arranged to operate at a second voltage which is higher than a first voltage, wherein the first voltage is the (normal) voltage of operation of the first transistor, and wherein the first transistor is isolated from the second voltage, and wherein the second voltage is arranged to substantially fully deplete the substrate in which the first transistor, the second transistor and the further device are constructed.

2. A semiconductor device according to claim 1, wherein the second voltage would damage the first transistor.

3. A semiconductor device according to claim 1, wherein the first transistor is isolated by means of a NWell.

4. A semiconductor device according to claim 1, wherein the semiconductor device comprises a SOI structure and a trench structure to isolate the first transistor.

5. A semiconductor device according to claim 1 wherein the further device comprises a diode.

6. A semiconductor device according to claim 5, wherein the diode is operated in avalanche mode.

7. A semiconductor device according to claim 1, wherein the further device comprises a transistor.

8. A semiconductor device according to claim 1, wherein the second voltage is at least 1.5 times the maximum operational voltage of the first transistor.

9. A semiconductor device according to claim 1, wherein the first transistor, the second transistor and the further device are constructed in an epitaxial layer of the substrate.

10. A semiconductor device comprising:
    a first transistor in a substrate;
    a second transistor in said substrate; and
    a further device in said substrate,
    wherein the second transistor and the further device are arranged to operate at a second voltage which is higher than a first voltage, wherein the first voltage is the (normal) voltage of operation of the first transistor, and wherein the first transistor is isolated from the second voltage, and wherein the second voltage is arranged to substantially fully deplete a layer of a common substrate in which layer the first transistor, the second transistor and the further device are constructed.

* * * * *